United States Patent
Yang et al.

(10) Patent No.: US 10,734,260 B2
(45) Date of Patent: Aug. 4, 2020

(54) DIE SORTING APPARATUS AND DIE SORTING METHOD

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Chen Yang, Shanghai (CN); Xin Xing Bai, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 108 days.

(21) Appl. No.: 15/687,209

(22) Filed: Aug. 25, 2017

(65) Prior Publication Data
US 2018/0068880 A1    Mar. 8, 2018

(30) Foreign Application Priority Data

Sep. 6, 2016    (CN) .......................... 2016 1 0803034

(51) Int. Cl.
*H01L 21/67*    (2006.01)
(52) U.S. Cl.
CPC .. *H01L 21/67271* (2013.01); *H01L 21/67132* (2013.01)

(58) Field of Classification Search
None
See application file for complete search history.

(56) References Cited

U.S. PATENT DOCUMENTS

| | | | | |
|---|---|---|---|---|
| 2004/0266094 A1* | 12/2004 | Nagai | ............... | H01L 21/67092 438/232 |
| 2007/0072394 A1* | 3/2007 | Shimizu | ............ | H01L 21/67271 438/462 |

FOREIGN PATENT DOCUMENTS

| | | |
|---|---|---|
| CN | 1577754 A | 2/2005 |
| CN | 102324393 | 1/2012 |

(Continued)

OTHER PUBLICATIONS

European Patent Application No. 17186557.9, Partial European Search Report dated Jan. 29, 2018, 7 pages.

(Continued)

*Primary Examiner* — Reema Patel
*Assistant Examiner* — Steven M Christopher
(74) *Attorney, Agent, or Firm* — Kilpatrick Townsend & Stockton LLP

(57) ABSTRACT

A die sorting apparatus includes a fixing mechanism for fixing a wafer having a plurality of dies, a positioning mechanism including an indicator for selecting a die of the wafer using die coordinates, an ejection mechanism below the wafer for applying a force to the selected die, a moving mechanism mechanically coupled to the positioning mechanism and the ejection mechanism for aligning the positioning mechanism with the ejection mechanism according to the die coordinates. The ejection mechanism includes an ejection shaft, a pin driven by the ejection shaft to apply the force to the selected die, and a pin driving device for moving the pin up and down through the ejection shaft. The die sorting apparatus also includes a die pickup device mounted (Continued)

in parallel to or integrated in the positioning mechanism for picking up the selected die that is separated form the wafer through the pin.

18 Claims, 3 Drawing Sheets

(56) References Cited

FOREIGN PATENT DOCUMENTS

| | | | |
|---|---|---|---|
| CN | 103077918 A | 5/2013 | |
| CN | 203765048 | 8/2014 | |
| CN | 104205317 | 12/2014 | |
| CN | 105823427 | 8/2016 | |
| JP | 08124994 A | 5/1996 | |
| JP | 2006332310 A | 12/2006 | |
| JP | 2012094634 | 5/2012 | |
| JP | 2012094634 A * | 5/2012 | ............. H01L 24/75 |

OTHER PUBLICATIONS

Chinese Application No. 201610803034.3, Office Action dated May 31, 2019, (English translation included) 18 pages.
Chinese Application No. 201610803034.3, Office Action dated Nov. 22, 2019, 5 pages.

* cited by examiner

DIE SORTING APPARATUS AND DIE SORTING METHOD

CROSS-REFERENCES TO RELATED APPLICATIONS

This application claims priority to Chinese patent application No. 201610803034.3, filed on Sep. 6, 2016, the content of which is incorporated herein by reference in its entirety.

FIELD OF THE INVENTION

The present invention relates generally to semiconductor technology. More particularly, embodiments of the present invention relate to the field of semiconductor device testing, and specifically to a die sorting device detection circuit and device.

BACKGROUND OF THE INVENTION

Conventional die (chip or integrated circuit) testing techniques require first cutting a wafer into chips (dies), then packaging the individual chips in packages. However, the packaged chips increase the volume of the chips. Wafer-level chip scale packaging (WLCSP) technology differs from conventional chip packaging technology. WLCSP technology puts the entire wafer in a package and tests the packaged wafer, and the tested wafer is then cut into dies. The volume of the dies after the package is basically the same as the original size of the dies. Due to the above characteristics of the chip-scale packaging technique, the requirements for die cutting are more stringent. In the current product inspection process, it is necessary to pick up packaged dies from different locations on the wafer to perform the test (including, but not limited to testing the quality of the side and back side of the packaged dies).

In the prior art, the selection of the dies is carried out using a manual selection approach, i.e., manually picking up a die to be tested using a vacuum needle may have the following problems. Firstly, a to-be-tested die is manually picked up, the vacuum needle may be in contact with neighboring dies, resulting in damage to the to-be-tested die and the neighboring dies. Secondly, the manually selection of a die is a random process that may cause wrinkles to the dicing tape, which, in turn, results in the failure of an incomplete scanning in an automatic optical detector test, and virtually increases the risk of releasing defective dies.

Thus, there is a need for an improved apparatus and method for automatic sorting semiconductor dies.

BRIEF SUMMARY OF THE INVENTION

The present inventors have discovered the above-described problems and provide an apparatus and a method for automatic sorting semiconductor dies or chips.

Embodiments of the present disclosure provide an apparatus for sorting a die on a wafer. The apparatus may include a fixing mechanism configured to fix a wafer having a plurality of dies, a positioning mechanism comprising an indicator configured to select a die of the wafer using die coordinates, an ejection mechanism disposed below the wafer and configured to apply a force to the selected die, and a moving mechanism mechanically coupled to the positioning mechanism and the ejection mechanism and configured to align the positioning mechanism with the ejection mechanism according to the die coordinates. The ejection mechanism includes an ejection shaft having a first end and a second end opposite the first end, a pin disposed at the first end of the ejection shaft and configured to apply the force to the selected die, a chamber configured to accommodate a portion of the ejection shaft and a portion of the pin, the chamber comprising a plurality of openings formed in the first surface of the chamber facing toward the wafer, an air vent, and a pin port configured to enable the pin to pass therethrough, and a pin driving device disposed outside the chamber and configured to move the pinup and down through the ejection shaft.

In one embodiment, the ejection mechanism may further include a suction port disposed at a second surface of the chamber opposite the first surface and coupled to a negative pressure generating device for generating a relatively lower pressure in the chamber with regard to an external pressure, and the wafer is attracted to the first surface of the chamber by the relatively lower pressure in the chamber when the ejection mechanism applies the force to the selected die.

In one embodiment, when the wafer is fixed by the fixing mechanism, the indicator is disposed above the wafer and aligned with the ejection mechanism.

In one embodiment, the moving mechanism includes a U-shaped arm, the indicator is disposed at one end of the U-shaped arm and the ejection mechanism is disposed at an opposite end the U-shaped arm, and the moving mechanism moves the positioning mechanism through the U-shaped arm to align with the ejection mechanism based on the die coordinates.

In one embodiment, the positioning mechanism also includes a calibration mechanism disposed at the one end of the U-shaped arm and configured to adjust an alignment of the indicator with the ejection mechanism, In one embodiment, the moving mechanism includes a first driving device and a second driving device configured to drive the positioning mechanism in a first direction and a second direction, respectively, according to the die coordinates, the first and second directions are orthogonal to each other. In one embodiment, the first and second driving devices each include a stepping motor and a guide rail.

In one embodiment, the guide rail of the first driving device and the guide rail of the second driving device each have an accuracy of less than 3 microns.

In one embodiment, the die sorting apparatus may further include a control device configured to adjust a displacement of the pin according to a thickness of the wafer.

In one embodiment, the indicator emits a laser beam having a diameter in a range between 0.2 mm and 0.3 mm.

In one embodiment, the pin of the ejection mechanism has an adjustable height or length in the vertical direction.

In one embodiment, the die sorting apparatus may further include a suction port disposed at a second surface of the chamber opposite the first surface, and a negative pressure generating device coupled to the suction port and configured to suck air out of the chamber through the suction port so that the chamber has a lower pressure with respect to an external pressure.

In one embodiment, the die sorting apparatus may also include a coordinate recognition device configured to identify coordinates of each die, a controller configured to control the moving mechanism according to coordinates provided by a user so that the positioning mechanism moves in a state of being aligned with the ejection mechanism to the selected die, and, after the positioning mechanism has been moved to be aligned with the selected die, control the ejection mechanism to apply a force to the die indicated by the positioning mechanism to separated the indicated die from the wafer.

In one embodiment, the die sorting apparatus may also include a die pick-up device configured to pick up the selected die separated from the wafer.

Embodiments of the present disclosure also provide a method for picking up a die disposed on a wafer having a plurality of dies. The method may include fixing a wafer having a plurality of dies using a fixing mechanism, selecting a die on the wafer using an indicator of a positioning mechanism, aligning the positioning mechanism with an ejection mechanism disposed below the wafer, and applying a force to the selected die from below the wafer using the ejection mechanism to separate the selected die from the wafer.

In one embodiment, the method may also include, prior to applying the force to the selected die, placing an electrostatic paper having an opening on the wafer, the opening exposing the selected die; and picking up the separated die that is ejected through the opening and disposed on the electrostatic paper using a vacuum nozzle The following description, together with the accompanying drawings, will provide a better understanding of the nature and advantages of the claimed invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

Figure 1:
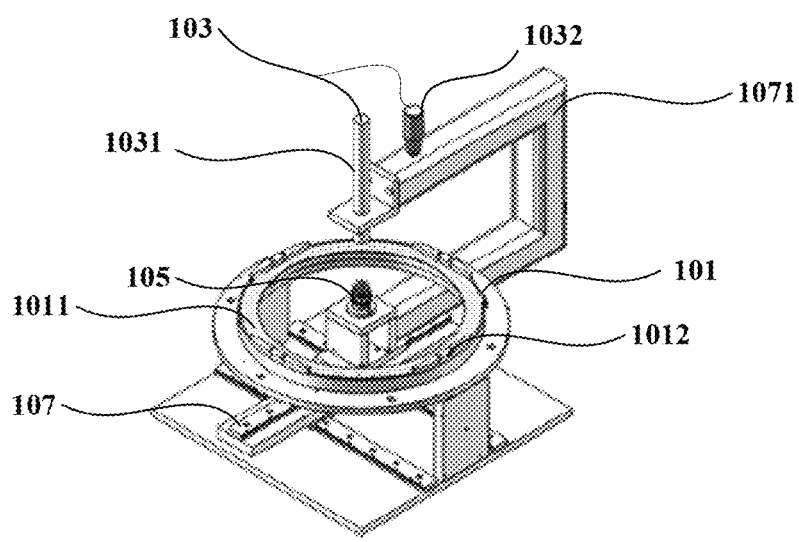
FIG. 1 is a perspective view illustrating a die sorting apparatus according to an embodiment of the present disclosure.
Figure 2:
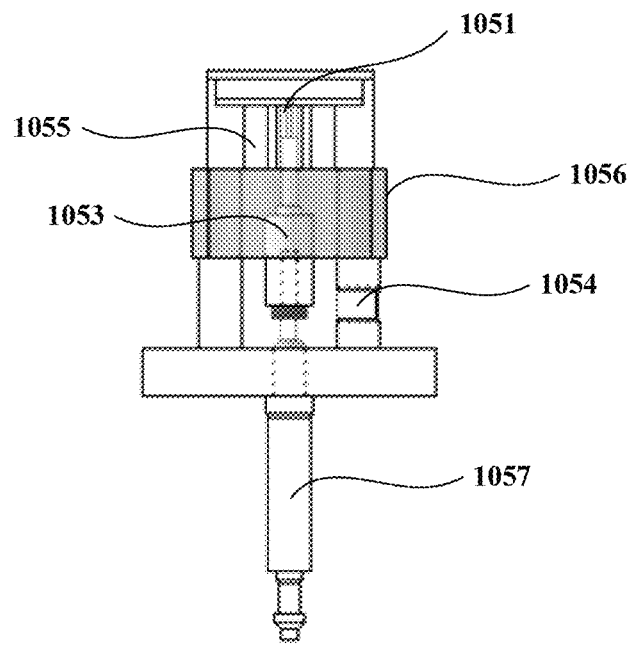
FIG. 2 is a schematic view illustrating an ejection mechanism according to an embodiment of the present disclosure.
Figure 3:
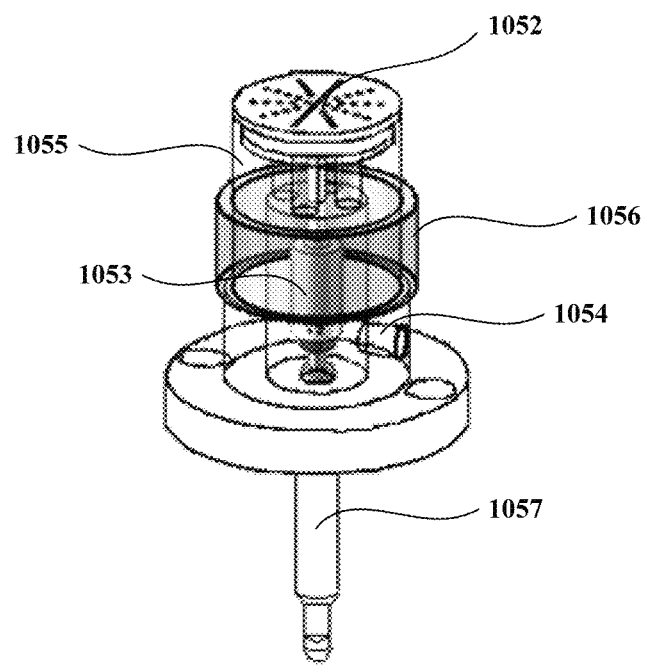
FIG. 3 is a perspective view illustrating an ejection mechanism according to an embodiment of the present disclosure.
Figure 4:
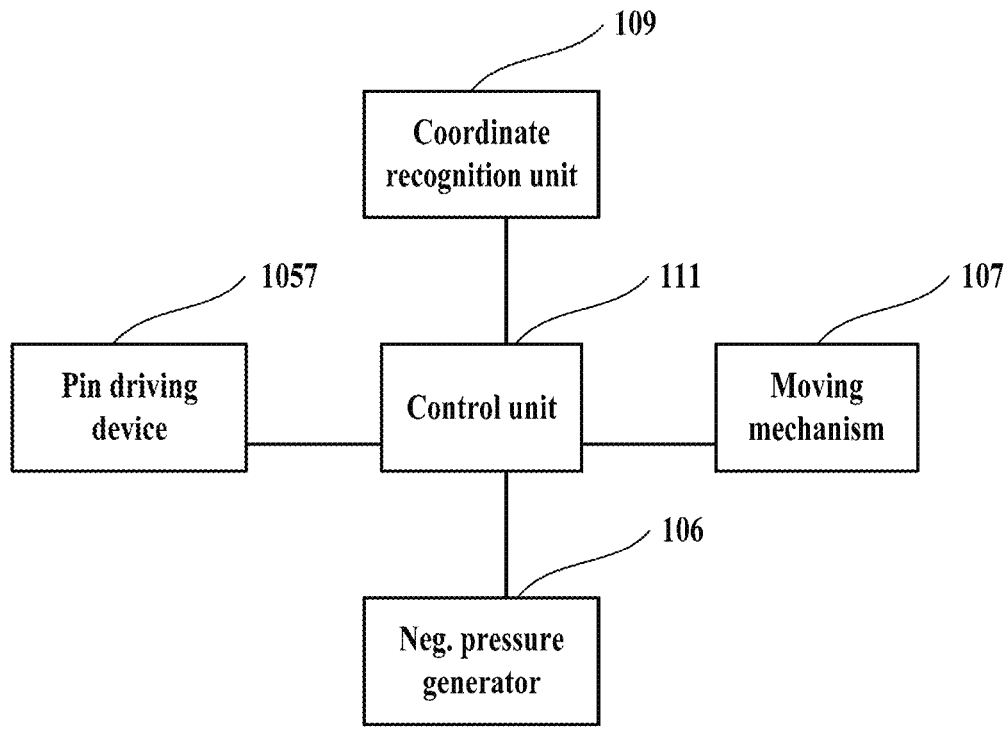
FIG. 4 is a simplified block diagram of a die picking apparatus according to an embodiment of the present disclosure.

FIG. 1 is a perspective view illustrating a die sorting apparatus according to an embodiment of the present disclosure. FIG. 2 is a schematic view illustrating an ejection mechanism according to an embodiment of the present disclosure. FIG. 3 is a perspective view illustrating an ejection mechanism according to an embodiment of the present disclosure. FIG. 4 is a simplified block diagram of a die picking apparatus according to an embodiment of the present disclosure. Embodiments of the present disclosure will be described with reference to FIGS. 1 through 4.

Referring to FIGS. 1 to 3, a die sorting apparatus of the present disclosure may include a fixing mechanism 101, a positioning mechanism 103, an ejection mechanism 105, and a moving mechanism 107.

Fixing mechanism 101 is configured to fix a wafer (not shown). The wafer may include a plurality of dies (integrated circuits or chips). The wafer may be pre-diced with a dicing saw so that the dies are partially separated from each other. In one embodiment, referring to FIG. 1, fixing mechanism 101 includes a frame 1011 configured to support an edge portion of the wafer. Frame 1011 may include a plurality of gripping tabs 1012 for securing the wafer. It is to be understood that the invention is not limited thereto. For example, fixing mechanism 101 may be implemented using a catching device, an engaging device, a pinching device, and the like to fix the wafer in such a way that prevents damage to the dies on the wafer.

Positioning mechanism 103 may include an indicator 1031 configured to indicate a die on the wafer based on provided die coordinates. In one embodiment, the provided die coordinates may be the center coordinates of the die. However, the present invention is not limited thereto. For example, the coordinates may be in the vicinity of the die center, or in the vicinity of an edge or a peripheral portion of the die. The die coordinates may be input by a user, or the die coordinates may be based on information by a system test library stored in a system storage.

In one embodiment, indicator 1031 may include a laser pointer that emits a laser beam to indicate the selected die. When the wafer is fixed to fixing mechanism 101, indicator 1031 is disposed above the wafer and indicates the selected die on the wafer according to the die coordinates using the laser beam; ejection mechanism 105 is disposed below the wafer and is aligned with indicator 1031. The laser beam emitted by indicator 1031 has a diameter of 0.2-0.3 mm. In one embodiment, positioning mechanism 103 may further include a calibration mechanism 1032 disposed at one end of an U-shaped arm 1071, calibration mechanism 1032 is configured to finely adjust (calibrate) the position of indicator 1031, so that indicator 1031 is aligned with an ejection pin 1051 (to be described in detail below) of ejection mechanism 105. As an example, calibration mechanism 1032 may include one or more fine adjustment knobs for adjusting the position of indicator 1031. The position of indicator 1031 may be adjusted to align with the corresponding ejection pin by rotating one or more fine adjustment knobs of calibration mechanism 1032. FIG. 1 shows an example of a fine adjustment knob of calibration mechanism 1032 so that indicator can be finely adjusted to align with ejection mechanism 105. It is noted that the term "align" or "alignment" may include a substantial alignment that may include errors and deviation that are within the process tolerance deemed appropriate in the art.

Ejection mechanism 105 is configured to apply a force to the die selected (and/or indicated) by positioning mechanism 103 to separate it from the wafer. Indicator 1031 may remain aligned with ejection mechanism 105. An exemplary ejection mechanism is shown in detail in FIGS. 2 and 3.

Referring to FIGS. 2 and 3, ejection mechanism 105 may include an ejection pin (alternatively also referred to as "pin") 1051 disposed at one end of an ejection shaft 1053 and configured to apply a force to the die. Ejection mechanism 105 may also include a chamber 1055 in which at least a portion of ejection shaft 1053 and a portion of pin 1051 are disposed. Ejection mechanism 105 may also include a plurality of openings 1052 formed in an upper surface of ejection mechanism 105 (the upper surface is the surface facing away from chamber 1055). Openings 1052 may include an air vent and a pin port configured to enable the pin to pass therethrough. The pin port may be, for example, the center opening of openings 1052, and the air vent may be, for example, one or more holes other than the pin port of openings 1053. Ejection mechanism 105 may also include a suction port 1054 formed in a surface of chamber 1055 facing away from the wafer or the selected die. Suction port 1054 may be connected to a negative pressure generating device (shown as block 106 in FIG. 4) that draws air out of chamber so that chamber 1055 has a relatively negative pressure (pressure lower than an outside or external pressure). As such, when the die sorting device is in operation, the negative pressure will cause the wafer (or a portion thereof) to be attached (sucked) to the surface of the ejection mechanism that is disposed opposite to the wafer's upper surface.

Ejection mechanism 105 may further include a pin driving device 1057 configured to drive pin 1051 by ejection shaft 1053 coupled thereto. In one embodiment, as shown in FIG. 2, pin driving device 1057 is disposed outside chamber 1055 for driving pin 1051 back and forth (up and down) by ejection shaft 1053 through the pin port in opening 1052.

When positioning mechanism 103 is moved by moving mechanism 107 to indicate a die corresponding to the target coordinates, since ejection mechanism 105 is aligned with positioning mechanism 103, ejection mechanism 105 and the selected die indicated by positioning mechanism 103 are also aligned. In this case, pin driving device 1057 can drive (e.g., through ejection shaft 1053) pin 1051 to apply a force to the selected die indicated by positioning mechanism 103. At this time, the wafer is attracted to the upper surface of chamber 1055 due to the relatively negative pressure in chamber 1055. Pin 1051 lifts (raises) the selected (and/or indicted) die as a target to separate it from the wafer.

In one embodiment, ejection mechanism 105 may also include a linear bearing 1056 configured to hold pin 1051 in the vertical direction. The parameters of ejection mechanism 105 (e.g., the top geometry of pin 1051, the length (or longitudinal dimension), the diameter (or lateral dimension), the force to drive the pin, the distance to drive the pin, etc.) may be determined or set according to practical applications (e.g., based on the thickness and brittleness of the wafer, the thickness of the dicing belt, and other factors). In one embodiment, the pin has an adjustable length to accommodate the thickness of the wafer.

In one embodiment, moving mechanism 107 is mechanically coupled to positioning mechanism 103 and ejection mechanism 105. Moving mechanism 107 may move indicator 1031 of positioning mechanism 103 based on the coordinates of the die to be positioned or to be indicated to align indicator 1031 with ejection mechanism 105. The coordinates may be derived, for example, from user input or automatically generated from a library file or a description file.

In one embodiment, moving mechanism 107 may include a U-shaped arm 1071 as shown in FIG. 1. Indicator 1031 may be coupled to one end of the U-shaped arm. Ejection mechanism 105 may be coupled or securely mounted to the opposite end of the U-shaped arm. Moving mechanism 107 may further include a first driving device (not shown) and a second driving device (not shown) for driving positioning mechanism 103 in a first direction and in a second direction, respectively. In one embodiment, the first and second directions are orthogonal to each other to align positioning mechanism 103 with ejection mechanism 105.

In an exemplary embodiment, the first driving device and the second driving device each may include a stepping motor and a guide rail. The guide rail of the first driving device and the guide rail of the second driving device are orthogonal to each other. The stepping motors of the first and second driving devices drive U-shaped arm 1071 to move along the guide rails in the first direction or in the second direction that are orthogonal to each other until indicator 1031 is aligned to the target coordinates (or aligned to the die corresponding to the target coordinates). In one embodiment, the guide rail of the first driving device may be, for example, represented by the plate extending below U-shaped arm 1071, and the guide rail of the second driving device may be, for example, represented by either or both plates below the plate extending below U-shaped arm 1071 (i.e., the guide rail of the first driving device).

In one embodiment, the guide rail of the first driving device and the guide rail of the second driving device each have an accuracy of less than ±3 microns. That is, the accuracy of moving mechanism 107 in the first direction or in the second direction is less than 3 microns. For example, the length of the guide rails of the first and second driving devices may be 300 mm, and the accuracy may be 3 microns.

After positioning mechanism 103 is moved so that indicator 1031 is aligned with the selected die (i.e., the die is selected according to the target coordinates), pin driving device 1057 drives pin 1051 to move upward through the pin port to raise or lift the die so that the die is separated from the wafer. At this time, chamber 1055 is in a relatively negative pressure, e.g., by drawing air out the chamber through suction port 1054 by a negative pressure generating device 106 (FIG. 4).

In one embodiment, the die sorting apparatus of the present disclosure may further include a die pick-up device configured to pick up the die separated from the wafer. In one embodiment, after positioning mechanism 103 is moved such that indicator 1031 indicates the selected die or aligns with the selected die (i.e., the die corresponding to the target coordinates), an electrostatic paper having an opening may be placed on the wafer, the opening may be disposed on the selected (indicated) die and has a size larger than the size of the selected die, enabling indicator 1031 to indicate or align the selected die. Pin 1051 is moved upwardly through the pin port by pin driving device 1057 and applies a force to the selected (indicated) die, which is then separated from the wafer and goes through the opening of the electrostatic paper. In this case, the die pick-up device may pick up the separated die. In this example embodiment, the die pick-up device may include a gripping device, a suction device, and the like. In another embodiment, the die pick-up device may be integrated with the indicator. In this case, the die pick-up device may include a suction nozzle (or vacuum nozzle) that can be raised and lowered. After the indicator indicates the selected die, the die pick-up device may be lowered to the wafer surface along an optical axis of the laser beam. After pin 1051 is driven upwardly by pin driving device 1057 through the pin port to separate the selected die from the wafer, the die pick-up device will pick up the separated die.

In another embodiment, the die sorting apparatus of the present disclosure may also include a coordinate recognition device 109 and a controller (control unit) 111, as shown in FIG. 4. Coordination recognition device 109 is configured to recognize the coordinates of the dies. For example, coordination recognition device 109 may identify the coordinates of the dies according to the alignment marks on the wafer and the size and layout of the dies. Controller (control unit) 111 is configured to move indicator 1031 of moving mechanism 103 to be aligned with ejection mechanism 105 corresponding to the selected die based on the input coordinates provided by a user. Of course, the coordinates in the present disclosure are not limited to coordinates provided by a user. For example, the coordinates in the present disclosure may be derived from an automatic generation of a library file or a description file.

When positioning mechanism 103 is moved to align indicator 1031 with the selected die (i.e., the die corresponding to the target coordinates), controller (control unit) 111 controls ejection mechanism 105 to apply a force to the selected die so that the selected die is separated from the wafer.

In one embodiment, referring to FIG. 4, the die sorting apparatus of the present disclosure may further include a negative pressure generating device (or negative pressure generator) 106. Negative pressure generating device 106 may be coupled to chamber 1055 through suction port 1054 to generate a relatively lower pressure in chamber 1055 with respect to the outside (external) pressure. In one exemplary embodiment, after positioning mechanism 103 has moved indicator 1031 to be aligned with the selected die (i.e., the die corresponding to the target coordinates), negative pressure generating device 106 generates a relatively lower pressure in chamber 1055 through suction port 1054 with respect to the external pressure, controller 111 further causes pin 1051 to move upwards by pin driving device 1057 to apply a force to the selected die to separate the selected die from the wafer.

In accordance with the present disclosure, a die sorting apparatus can precisely locate a die to be picked up. The die sorting apparatus of the embodiments of the present disclosure may prevent damage caused to the selected die and neighboring dies during detachment, and deformation of the dicing tape of conventional techniques.

Figure 5:
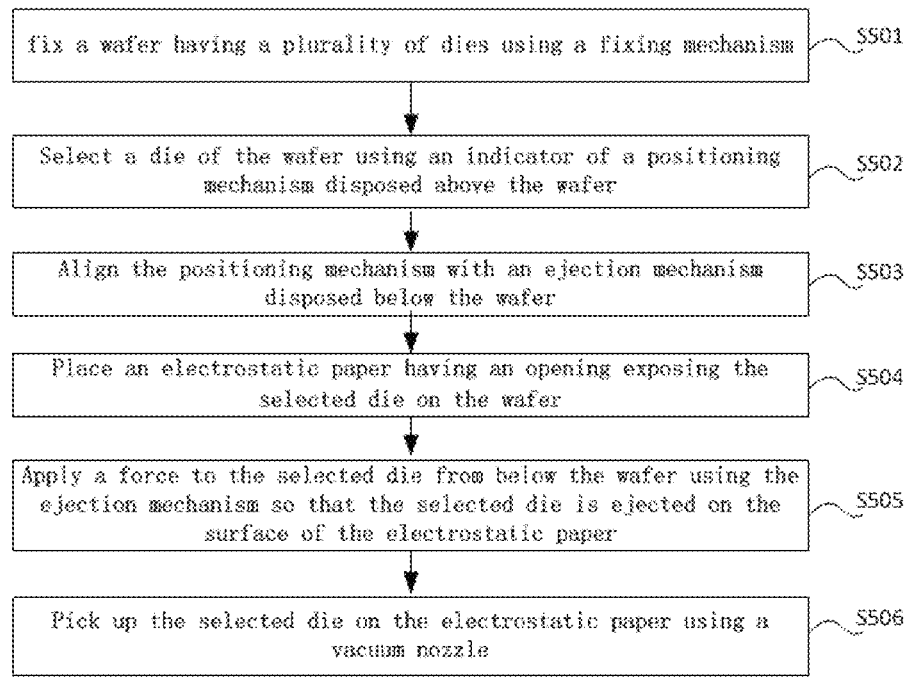
FIG. 5 is a flowchart illustrating a method for picking up a die disposed on a wafer having a plurality of dies according to an embodiment of the present disclosure.

FIG. 5 is a flowchart of a method for picking up a die of a wafer having a plurality of dies according to an embodiment of the present disclosure. The method may include the following steps:

S501: fix a wafer comprising a plurality of dies using a fixing mechanism;

S502: select a die of the wafer using an indicator of a positioning mechanism disposed above the wafer;

S503: align the positioning mechanism with an ejection mechanism disposed below the wafer;

S504: place an electrostatic paper having an opening on the wafer, the opening exposing the selected die;

S505: apply a force to the selected die from below the wafer using the ejection mechanism to separate the selected die from the wafer. The selected die is ejected and disposed on the surface of the electrostatic paper opposite the ejection mechanism;

S506: pick up the die using a vacuum nozzle disposed above the surface of the electrostatic paper. In one embodiment, the vacuum nozzle may be integrated in the indicator of the positioning mechanism, and can move up and down under a control of a control unit. In one embodiment, the indicator emits a laser beam to indicate the selected die to a user.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A die sorting apparatus, comprising:
    a fixing mechanism configured to fix a wafer comprising a plurality of dies;
    a positioning mechanism comprising an indicator configured to select a die of the wafer using die coordinates;
    an electrostatic paper having an opening with a surface area greater than a surface area of the selected die, the opening configured to enable the indicator to align the selected die;
    an ejection mechanism disposed below the wafer and configured to apply a force to the selected die;
    a moving mechanism mechanically coupled to the positioning mechanism and the ejection mechanism and configured to align the positioning mechanism with the ejection mechanism according to the die coordinates;
    wherein the ejection mechanism comprises:
        an ejection shaft having a first end and a second end opposite the first end;
        a pin disposed at the first end of the ejection shaft and configured to apply the force to the selected die;
        a chamber configured to accommodate a portion of the ejection shaft and a portion of the pin;
        a plurality of openings formed in a first surface of the chamber facing toward the wafer, the plurality of openings comprising an air vent and a pin port, the pin port configured to enable the pin to pass therethrough; and
        a pin driving device coupled to the second end of the ejection shaft and disposed outside the chamber, the pin driving device configured to move the pin up and down through the pin port;
    wherein the moving mechanism comprises:

a first driving device having a first guide rail in a first direction; and a second driving device having a second guide rail in a second direction orthogonal to the first direction, the first and second guide rails being disposed below the ejection mechanism.

2. The die sorting apparatus of claim 1, wherein the ejection mechanism further comprises a suction port disposed at a second surface of the chamber facing away from the wafer for drawing air out of the chamber to generate a relatively lower pressure in the chamber with regard to an external pressure;

the wafer is attracted to the first surface of the chamber by the relatively lower pressure in the chamber when the ejection mechanism applies the force to the selected die.

3. The die sorting apparatus of claim 1, wherein, when the wafer is fixed by the fixing mechanism, the indicator is disposed above the wafer and aligned with the ejection mechanism.

4. The die sorting apparatus of claim 1, wherein the moving mechanism comprises a U-shaped arm, the indicator is disposed at one end of the U-shaped arm and the ejection mechanism is disposed at an opposite end the U-shaped arm; and the moving mechanism moves the positioning mechanism through the U-shaped arm to align with the ejection mechanism based on the die coordinates.

5. The die sorting apparatus of claim 4, wherein the positioning mechanism further comprises a calibration mechanism disposed at the one end of the U-shaped arm and configured to adjust an alignment of the indicator with the ejection mechanism.

6. The die sorting apparatus of claim 1, wherein the first and second driving devices each further comprise a stepping motor.

7. The die sorting apparatus of claim 6, wherein the stepping motor of the first driving device drives the positioning mechanism along the first guide rail of the first driving device along the first direction with a first positional accuracy of less than 3 microns and the stepping motor of the second driving device drives the positioning mechanism along the second guide rail of the second driving device along the second direction with a second positional accuracy of less than 3 microns.

8. The die sorting apparatus of claim 1, further comprising a control device configured to adjust a displacement of the pin according to a thickness of the wafer.

9. The die sorting apparatus of claim 1, wherein the indicator emits a laser beam having a diameter in a range between 0.2 mm and 0.3 mm.

10. The die sorting apparatus of claim 1, wherein the pin of the ejection mechanism has an adjustable length.

11. The die sorting apparatus of claim 1, further comprising:

a suction port disposed at a second surface of the chamber facing away from the wafer;

a negative pressure generating device coupled to the suction port and configured to draw air out of the chamber through the suction port so that the chamber has a lower pressure with respect to an external pressure.

12. The die sorting apparatus of claim 1, further comprising:

a coordinate recognition device configured to identify coordinates of each die;

a controller configured to:

control the moving mechanism according to coordinates provided by a user so that the positioning mechanism moves in a state of being aligned with the ejection mechanism to the selected die; and after the positioning mechanism has been moved to be aligned with the selected die, control the ejection mechanism to apply a force to the die indicated by the positioning mechanism to separate the indicated die from the wafer.

13. The die sorting apparatus of claim 12, further comprising:

a suction port disposed at a second surface of the chamber facing away from the wafer;

a negative pressure generating device configured to draw air out of the chamber through the suction port so that the chamber has a lower pressure with respect to an external pressure, wherein the control is further configured to:

control the negative pressure generating device to generate a negative pressure in the chamber when the positioning mechanism is aligned with the selected die, and control the pin driving device to actuate the pin through the ejection shaft to move upwardly, thereby applying a force to the selected die to separate the selected die from the wafer.

14. The die sorting apparatus of claim 1, further comprising:

a die pick-up device configured to pick up the selected die separated from the wafer.

15. The die sorting apparatus of claim 1, wherein the selected die passes through the opening when the ejection mechanism applies the force to the selected die.

16. The die sorting apparatus of claim 15, further comprising a die pick-up device configured to pick up the selected die that has passed through the opening of the electrostatic paper.

17. The die sorting apparatus of claim 1, wherein the first guide rail has a length of 300 mm.

18. The die sorting apparatus of claim 1, wherein the second guide rail has a length of 300 mm.

* * * * *